(12) United States Patent
Ahmad et al.

(10) Patent No.: US 7,939,456 B2
(45) Date of Patent: May 10, 2011

(54) METHOD AND APPARATUS FOR UNIFORM MICROWAVE TREATMENT OF SEMICONDUCTOR WAFERS

(75) Inventors: Iftikhar Ahmad, Raleigh, NC (US); Keith R. Hicks, Garner, NC (US)

(73) Assignee: Lambda Technologies, Inc., Morrisville, NC (US)

( * ) Notice: Subject to any disclaimer, the term of this patent is extended or adjusted under 35 U.S.C. 154(b) by 0 days.

(21) Appl. No.: 12/924,004

(22) Filed: Sep. 17, 2010

(65) Prior Publication Data

US 2011/0076787 A1 Mar. 31, 2011

Related U.S. Application Data

(60) Provisional application No. 61/277,542, filed on Sep. 25, 2009.

(51) Int. Cl.
*H01L 21/00* (2006.01)
*H05B 6/66* (2006.01)
*F27B 5/16* (2006.01)

(52) U.S. Cl. .............. 438/798; 257/E21.497; 432/200; 219/702

(58) Field of Classification Search .............. 438/5, 663, 438/798; 432/200; 219/702
See application file for complete search history.

(56) References Cited

U.S. PATENT DOCUMENTS

| | | | | |
|---|---|---|---|---|
| 5,321,222 | A | * | 6/1994 | Bible et al. |
| 5,648,038 | A | * | 7/1997 | Fathi et al. |
| 5,721,286 | A | * | 2/1998 | Lauf et al. ................. 522/1 |
| 5,738,915 | A | * | 4/1998 | Fathi et al. |
| 5,851,319 | A | * | 12/1998 | Atwater et al. |
| 5,961,871 | A | * | 10/1999 | Bible et al. |
| 6,313,123 | B1 | * | 11/2001 | Levin et al. |
| 6,395,099 | B1 | * | 5/2002 | Pan |
| 6,969,692 | B2 | * | 11/2005 | Brady et al. |
| 7,569,800 | B2 | * | 8/2009 | Tian et al. |
| 2004/0128021 | A1 | * | 7/2004 | Klekotka |
| 2005/0118812 | A1 | * | 6/2005 | Donohue et al. |
| 2007/0215607 | A1 | * | 9/2007 | Wander et al. |
| 2007/0215612 | A1 | * | 9/2007 | Hicks et al. |

* cited by examiner

*Primary Examiner* — W. David Coleman
(74) *Attorney, Agent, or Firm* — Robert J. Lauf

(57) ABSTRACT

A microwave heating system comprises a microwave applicator cavity; a microwave power supply to deliver power to the applicator cavity; a dielectric support to support a generally planar workpiece; a dielectric gas manifold to supply a controlled flow of inert gas proximate to the periphery of the workpiece to provide differential cooling to the edge relative to the center; a first temperature measuring device configured to measure the temperature near the center of the workpiece; and, a second temperature measuring device configured to measure the temperature near the edge of the workpiece. The gas flow is controlled to minimize the temperature difference from center to edge, and may be recipe driven or controlled in real time, based on the two temperature measurements. The method is particularly useful for monolithic semiconductor wafers, various semiconducting films on substrates, and dielectric films on semiconducting wafers.

18 Claims, 6 Drawing Sheets

METHOD AND APPARATUS FOR UNIFORM MICROWAVE TREATMENT OF SEMICONDUCTOR WAFERS

CROSS REFERENCE TO RELATED APPLICATION

This application claims the benefit of U.S. Provisional Application Ser. No. 61/277,542, filed on Sep. 25, 2009 by the present inventors, the entire disclosure of which is incorporated herein by reference.

BACKGROUND OF THE INVENTION

1. Field of the Invention

The invention pertains to apparatus and methods for heat treating semiconductor wafers and more particularly to apparatus and methods for uniformly heating semiconductor wafers using microwave energy.

2. Description of Related Art

Single frequency microwaves have been explored for annealing ion implanted semiconductor wafers in the past. Heating semiconductors with microwave energy is very effective, leading to the interest of annealing wafers. However, as the size of the wafers has grown to 300 mm, used routinely today, uniform heating of the entire wafer is a challenge with fixed frequency microwaves. It will get even more difficult as the industry moves to 450 mm wafers. Furthermore, when it comes to placing metal components, circuits as well as metal coated wafers in a fixed frequency microwave cavity, the challenges are escalated: the arcing of metals tends to damage the circuits, and this becomes a major barrier to using this approach for the production of semiconductor devices.

One important heat treatment application involves annealing wafers to form metal silicides, which have been widely applied to IC fabrication because of their high melting points and low resistance. Use of fixed-frequency microwaves for this application has generally been unsuccessful. It should be noted that although single or fixed frequencies can in theory be used for microwave heating of semiconductors, they generally produce non-uniform heating, and when metal films are involved arcing with these films becomes a serious issue. However, pulsed microwave beam as described in U.S. Pat. No. 6,316,123, by Lee et al. has been used to locally heat and convert the metal to silicides. The pulse duration was of the order 0.02 to 0.15 seconds. This approach is similar to the laser spot annealing used on semiconductor wafers.

Metal silicides have been widely applied to IC fabrication. As the critical dimensions for contact area and source/drain regions become progressively smaller, nickel silicide is emerging to be the choice of material over cobalt and titanium silicide. However, the nickel silicide system has various phases and undergoes phase transformation during the heating cycle. Among all the phases, the lowest resistivity NiSi is the desired silicide phase for contacts to a semiconductor device. Thus there is the need to make sure that there is no temperature variation on the wafer so that the same phase is formed over the entire surface. Higher or lower temperature will alter the phase formation and hence the resistivity of the silicides.

Another important application involves the annealing or activation of dopant species in the silicon wafer following ion implantation, used for fabricating UltraShallow Junctions (USJ) and devices. The annealing process repairs the implantation damage and activation provides good conductivity. The key elements in forming USJ are junction depth and sheet resistance, and process manufacturability and repeatability. These shallow junctions demand low thermal budgets, requiring processing at a high ramp rate with a minimum of peak temperature overshoot. In a high-volume production environment it is critical to measure and control temperature for any thermal process. Lamp-based RTP spike-anneal has enabled recent production while laser spike-anneal (LSA) is emerging and even being claimed as the process of record for current high performance semiconductor device manufacturing. Generally, these are very short duration processes and there are challenges in measuring and controlling peak temperatures in spike-anneal process. The high temperature spikes may also lead to wafer warpage and strain in the device structure.

OBJECTS AND ADVANTAGES

Objects of the present invention include the following: providing an apparatus for heating semiconductor wafers using microwave energy; providing a microwave heating system having improved temperature control; providing a microwave heating system adapted to heat large semiconductor wafers uniformly; providing a method to anneal metal-coated semiconductor wafers to form metal silicides thereon; and, providing a method for microwave treatment of ion implanted semiconductor wafers. These and other objects and advantages of the invention will become apparent from consideration of the following specification, read in conjunction with the drawings.

SUMMARY OF THE INVENTION

According to one aspect of the invention, an apparatus for processing semiconductor wafers comprises:

a microwave applicator cavity;

a microwave power supply configured to deliver power to the applicator cavity;

a dielectric support configured to support a semiconductor wafer having a selected diameter;

a dielectric gas manifold configured to supply a controlled flow of inert gas proximate to the periphery of the semiconductor wafer to provide differential cooling to the wafer edge relative to the wafer center; and a first temperature measuring device configured to measure the temperature near the center of the wafer and a second temperature measuring device configured to measure the temperature near the edge of the wafer.

According to another aspect of the invention, a method for processing semiconductor wafers comprises the steps of:

supporting a semiconductor wafer to be processed on a dielectric supporting member within a microwave applicator cavity;

introducing microwave energy into the cavity;

measuring the temperature of the wafer at a first point near its center and at a second point near its periphery; and, supplying a controlled flow of gas proximate to the periphery of the wafer sufficient to provide differential cooling to the wafer edge relative to the wafer center.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illus

DETAILED DESCRIPTION OF THE INVENTION

Figure 1:
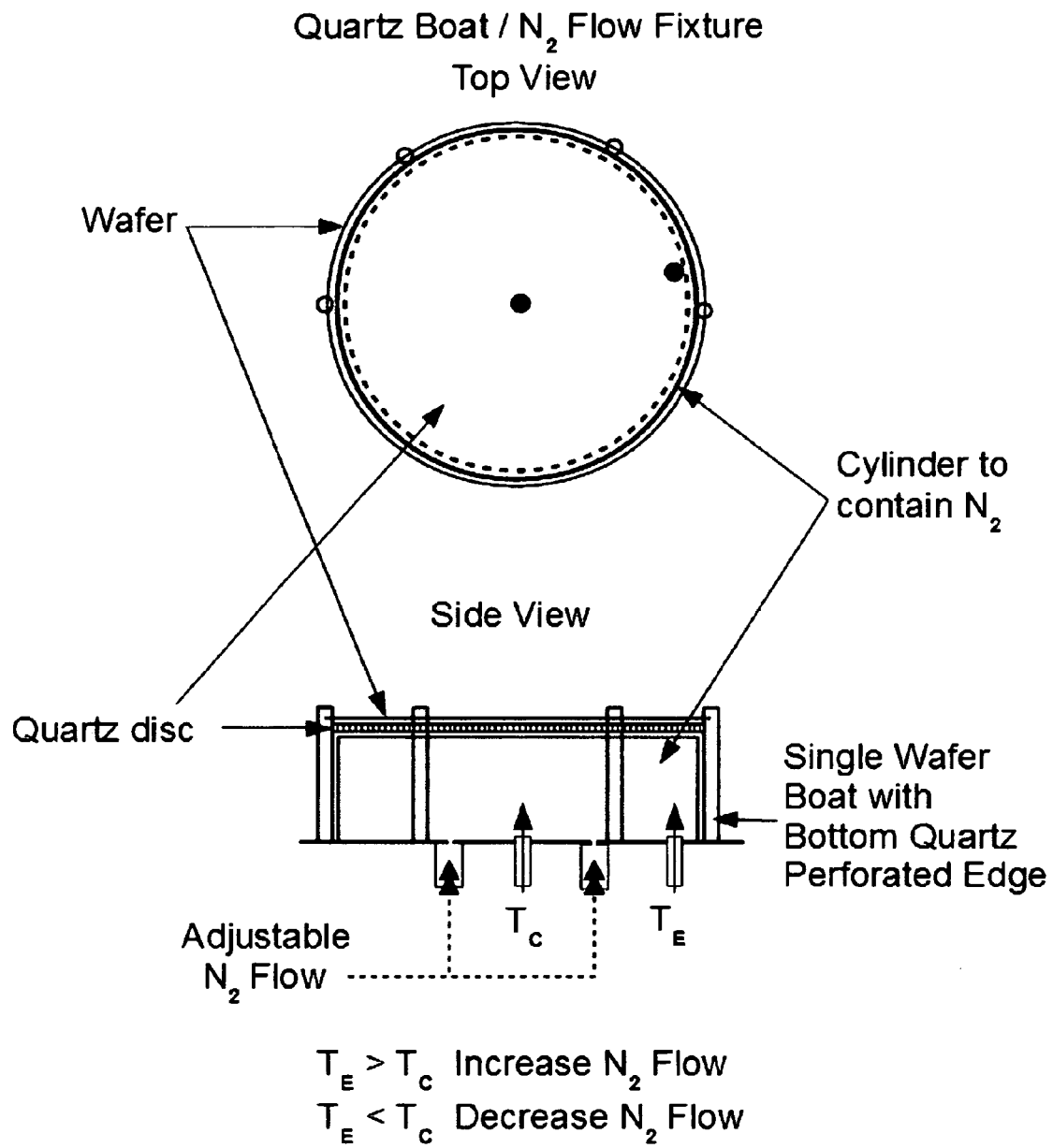
- FIG. 1 illustrates the use of a quartz fixture allowing gas flow adjacent to the edge of a wafer undergoing microwave processing according to one aspect of the invention.

Variable Frequency Microwave (VFM) is well suited for processing semiconductor materials. The basic VFM approach is well-known and taught in at least the following U.S. patents, each of which is incorporated herein by reference in its entirety: U.S. Pat. Nos. 5,321,222; 5,721,286; 5,961,871; 5,521,360; 5,648,038; and 5,738,915. In particular, the continuous sweeping of frequencies over the available bandwidth, as taught in the aforementioned references, reduces the potential for arcing and subsequent damage. Frequency sweeping is often carried out by selecting a center frequency and then rapidly sweeping the frequency in a substantially continuous way over some range (typically +/−5% of the center frequency, although this range can vary depending on such factors as the type of microwave source, and the overall size of the cavity compared to the microwave wavelength). Numerous kinds of wafers with integrated circuits have been exposed to VFM and it has been demonstrated that there is no damage to the circuits or their functionality. The use of VFM provides more rapid processing as compared to conventional annealing furnaces.

Thus VFM process provides the means of using microwave energy as a continuous wave (CW in contrast to pulse) to anneal wafers with coatings of cobalt, titanium or nickel to form their respective silicides. The uniformity of heating with VFM further offers the potential to scale up from 300 mm to 450 mm wafers.

As noted earlier, one objective of the invention is to provide uniform and rapid microwave annealing of large semiconductor wafers, especially the wafers with metallizations that cannot be easily processed with single frequency microwave because of the potential for damaging arc formation. Exemplary processes include fabrication of a metal silicides as well as dopant activation and oxidation of silicon.

It is instructive to review briefly the general thermal behavior of a large thin wafer of the type used in semiconductor manufacturing. When a heated wafer is pulled out of an oven the edges of the wafer (having higher surface/volume ratio) are the first to cool on the entire wafer. The same applies (instantaneously) when the wafer is placed in a convection oven where the hot air around the wafer tries to heat the wafer. After a transient period in which the wafer edge is hotter than the center, the wafer eventually reaches equilibrium with the environment and is uniformly hot. Similarly, in rapid VFM heating the edges of the wafer will heat more during the temperature ramp up and eventually as the high temperature is achieved and the soak stage starts, the gradient between the center and edge of the wafer will diminish. One of the objectives of the invention, in addition to the uniform VFM heating of metalized wafers, is to control the temperature gradient between the center and edge of the wafer, even during the temperature ramp up.

For the annealing processes of silicidation and dopant activation, nitrogen is generally used to minimize oxidation of silicon. The flow of nitrogen can be instrumental to minimizing the temperature gradient between the edge and center of the wafer. It will be appreciated that other gases may be used for particular applications.

The experimental set up for this approach is shown schematically in FIG. 1. A quartz fixture is placed in a microwave cavity. (One particularly suitable cavity is the MicroCure® 2100, made by Lambda Technologies, Inc., Morrisville, N.C.) The quartz, being microwave transparent, will allow microwave energy to travel in the chamber without any restriction. Quartz boats are standard carriers for wafers in the semiconductor industry. Nitrogen flow is plumbed from the bottom of the cavity. A single-wafer quartz boat can be modified to include a thin-walled quartz cylinder and a thin top quartz plate (with perforation only on the edges) attached to the cylinder. As nitrogen is allowed into this quartz containment the only path for nitrogen to flow is through these tiny perforations, which act as nozzles to blow cool nitrogen on the edges of the wafer. The wafer is placed in a slot on the boat above the perforated quartz plate. It will be appreciated that other configurations of the gas manifold may be substituted for the configuration shown in FIG. 1. For example, quartz tubing may be formed into a ring approximately the same diameter as the wafer and holes drilled at various points along the tube, thereby achieving the same effect of discharging a controlled flow of gas around the periphery of the wafer Silicon is transparent at optical (IR) wavelengths longer than 1.1 µm and this is known to make IR temperature monitoring with longer wavelengths more difficult. Thus the temperature monitoring for this arrangement is performed using the small wavelength (0.9 µm) devices. One of the advantages of using such a device is that the temperature can be monitored through a quartz window, or in this case the quartz plate disposed between the wafer and temperature monitoring device. It will be understood that there will be some transmission losses through quartz; this can easily be corrected by using the Radiance Multiplier to calibrate it for viewing through quartz. Making the measurement from the underside of the wafer eliminates the effect of surface composition changes (silicon, metals, dielectric) from run to run or from process to process.

EXAMPLE

A setup with two temperature monitoring devices, one in the center of the wafer and another one toward the edge of the wafer, is shown generally in FIG. 1. During the ramp up when the edge temperature $T_E$ is higher than the center temperature $T_C$, the nitrogen flow must be increased to compensate. As the soak temperature is approached, the VFM power requirement goes down and $T_E$ is no longer leading, the nitrogen flow can be reduced so that the condition $T_E \approx T_C$ is maintained during the ramp as well as the soak stage. The nitrogen flow can be controlled to be proportional to the temperature differential $T_E-T_C$, thus providing an automatic control mechanism to enable the wafer temperature to be uniform over the entire process.

It will be appreciated that in many cases the gas flow may be dynamically controlled in a real-time feedback loop that is directly related to the output of the two temperature sensors. However, in other cases it may be adequate to use a recipe-driven control system, wherein the setup is initially calibrated in one or more test runs for a semiconductor wafer with a particular set of properties, and when the best process cycle is determined, it is simply stored and repeated whenever a wafer of that type is processed.

It is well known that steep thermal profiles give the best junction characteristics by limiting dopant diffusion. The primary challenge is the ability to deliver consistent process uniformity for production worthiness, measured by within-wafer uniformity and wafer-to-wafer repeatability, to get product yield from the wafer edge especially as device geometries shrink, where an even shallower junction must be ensured. The successful integration of any type of anneal requires control on low thermal budget history to ensure limited dopant diffusion and least deformation and process-induced stresses.

The present invention provides a method for low thermal budget and low stress process by achieving activation through uniform heating in the temperature range up to about 600° C. using Variable Frequency Microwaves. With conventional heating at higher temperatures the silicon expands according to its coefficient of thermal expansion. With current heating methods, it is around a 1000° C. that the lattice structure allows the arsenic dopant ion to occupy the lattice position of silicon and impart conductivity to the semiconductor, when annealing and activation occurs. Depending on the particular dopant and the resistivity of the semiconductor wafer, the optimal temperature might be as low as 300° C.

With VFM heating the expansion of the lattice at any given temperature will be the same as with any heating method. However, one needs to consider the different mechanism of heating with VFM. For heating polar liquids like water, the polar molecule is set into rotation by the alternating electromagnetic field. The mobility of the water molecule is higher as compared to heating with conventional means. The microwave enhancement in chemical synthesis (where applicable—when polar molecules are present), is a result of the higher mobility and hence the higher probability of the reactants to combine and form the reaction product.

In solids, the free rotation of dipoles is not practical. However, the microwave interaction mechanism with the material does not simply disappear. The tendency for a rotational movement will be there. For example, a single bond is more likely to respond to microwaves as compared to a double bond and obviously a triple bond will have the most restrictive movement if any. There would be more heat generation in the single bond situation versus the double bond and the least in the triple bond.

Considering the material of our interest, silicon, although the detailed and exact heating mechanism remains somewhat conjectural, what is very clear is that doped silicon wafers heat very well with VFM. Thus, there is VFM interaction with silicon and the dopant ions that impart the conductivity to silicon. As the temperature increases lattice expansion will occur no matter what the heating mechanism. The VFM interaction with the dielectric and charge carriers will allow the dopant ions to drift into the lattice (substituting for silicon) position at a temperature lower than those used for conventional heating methods. The apparent VFM induced enhanced mobility within the lattice also allows repair of the damage cause by the implant process. Thus the annealing and activation of As-implanted wafers can be performed at lower temperature, around 550° C. or so. The lower temperature VFM activation ensures that there will be limited dopant diffusion and will not influence the performance and reliability of the semiconductor devices.

EXAMPLE

Annealing tests were done using samples of silicon consisting of p-type boron doped (100) orientated Si. These wafers have been implanted at room temperature with 30 keV $As^+$ ions with doses $5\times10^{15}$ $As^+$ $cm^{-2}$. The projected range ($R_P$) and straggle ($\Delta R_P$) are 26 and 9 nm, respectively. Post implantation anneals were performed using Lambda Technologies' Variable Frequency Microwave (VFM) system equipped with a 1600 Watt output amplifier. The key component for this tool was the Traveling Wave Tube (TWT) amplifier with frequency sweep from 5.85-6.65 GHz. The swept frequency provided a more uniform microwave field and temperature uniformity as compared to fixed frequency microwave and allows processing of electronic components without causing any damage. The temperature of the silicon samples was monitored as a function of time within the reactor by the use of Photrix IR device manufactured by Luxtron Corporation (now LumaSense Technologies). For all samples, the anneal temperature range was 500-540° C.

Samples were characterized prior to and after microwave annealing. The implant damage was quantified by ion channeling and conventional Rutherford backscattering spectrometry (RBS) using a 2.0 MeV $He^+$ analyzing beam. During ion channeling analysis, samples were analyzed in random and in the aligned [001] channeled orientation. $He^+$ ions were collected using a solid state detector, positioned 13° from the incident beam. Layer thicknesses were estimated from RBS data.

Figure 2:
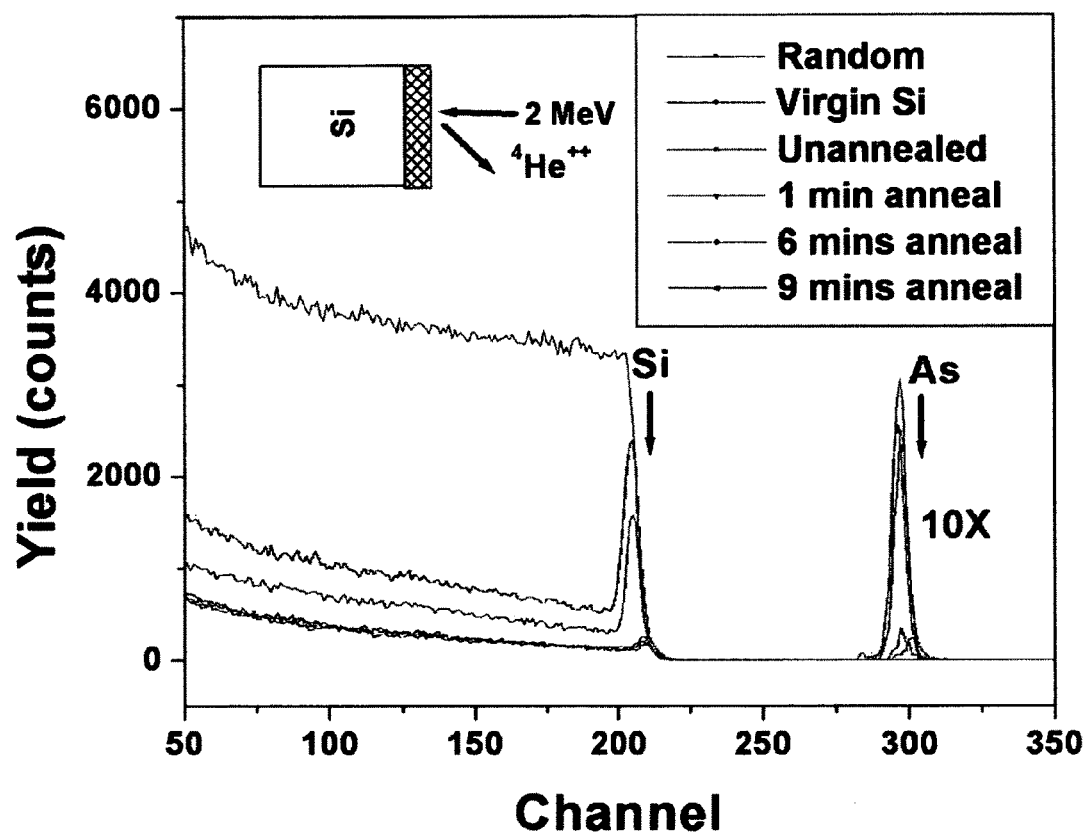
FIG. 2 illustrates the result of RBS measurements on ion-implanted Si processed according to one example of the present invention.
Figure 3:
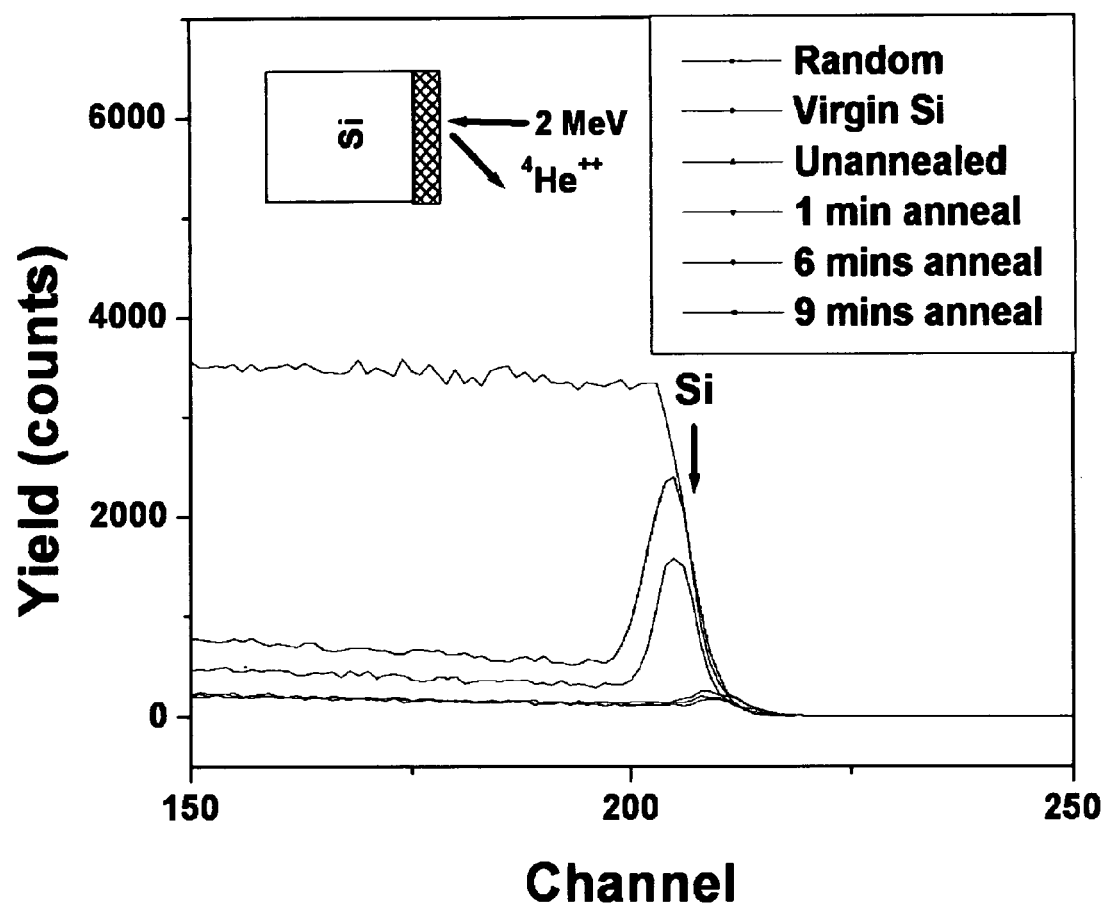
FIG. 3 illustrates a portion of the RBS spectrum presented in FIG. 2, emphasizing the annealing of near-surface implantation damage.
Figure 4:
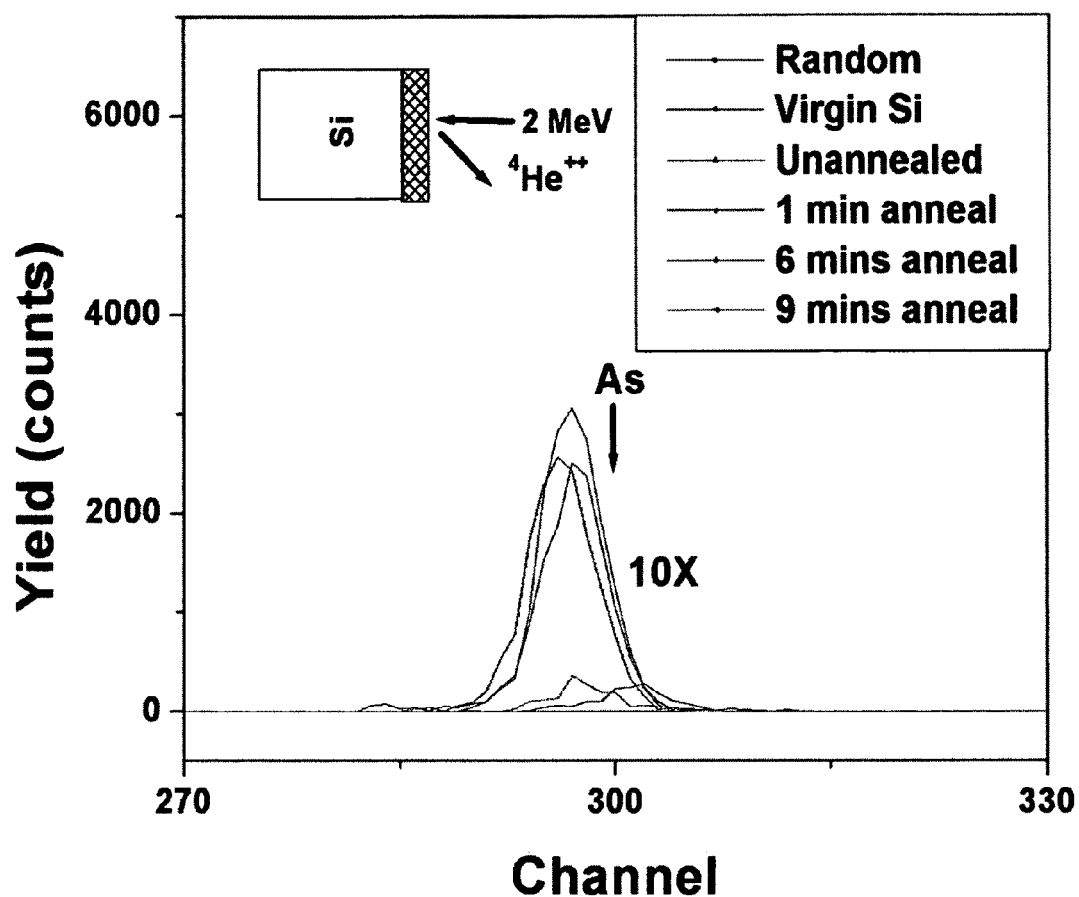
FIG. 4 illustrates another portion of the RBS spectrum presented in FIG. 2, emphasizing the annealing of implanted As ions, causing them to adopt substitutional positions on the Si lattice.

Detailed characterization results are presented as Appendix A, "Variable Frequency Microwave Activation and Solid Phase Regrowth of Arsenic Ion-Implanted Silicon at Temperatures below 550° C.," in Applicants' aforementioned Provisional Application 61/277,542. The characterization results may be summarized as follows:

FIGS. 2-4 display the results of ion channeling analysis of silicon samples implanted with 30 keV, $5\times10^{15}$ $As^+$ $cm^{-2}$ prior to and after microwave annealing for times up to 9 minutes. FIG. 2 shows spectrum corresponding to the randomly oriented RBS spectrum for as-implanted silicon. Note the As signal has been increased by a factor of ten for clarity. In addition the figure shows the aligned spectra corresponding to ion channeling analysis with $As^+$ implanted samples oriented in a [001] channeled direction, and [001] channeled spectrum for un-implanted silicon. The as-implanted spectrum demonstrates that a highly damaged silicon layer exists near the surface of the silicon. Comparison of the yield from the aligned and random spectra demonstrates that the as-implanted sample contains a layer of disorder, but with the degree of disorder being less than that in amorphous silicon.

The spectra from the annealed samples demonstrate that samples processed for times greater than 6 minutes showed a significant reduction in the lattice damage incurred during high dose ion implantation. Comparison of the normalized yield spectrum with that of un-implanted silicon demonstrates that VFM processing results in almost complete repair of ion implantation damage. Normalized yield comparisons (i.e., $\chi_{min}$, the ratio of channeled yield to random yield) of silicon spectra results in a $\chi_{min}$ of 0.3 whereas $\chi_{min}$ of the un-implanted silicon was 0.28. In all samples annealed for times greater than 6 minutes, the ion channeled spectra approximated those of spectrum virgin silicon. These results would imply complete solid phase epitaxial regrowth.

Inspection of the As signals in FIG. 4 shows that increased annealing times results in reduced As signal. This implies that the As atom are sitting substitutionally on Si matrix site (i.e. dopant is activated). Ion channeling analysis also provides a means to quantify the fraction of As atoms residing substitutionally on Si (host-atom) sites and it is calculated from the measured $\chi_{Si}$ and $\chi_{As}$ using the following expression, % As on Si sites=$(1-\chi_{As})/(1-\chi_{Si})$ where $\chi_{As}$ and $\chi_{Si}$ are the chi minimum (the ratio of the yield from the aligned spectrum to the random spectrum) from the As and Si signals, respectively. The values of % As on Si sites are tabulated in Table 1.

Although FIGS. 2-4 demonstrate that dopant activation occurs during microwave processing, they do not determine the extent of dopant activation. To demonstrate the increase in resultant carrier concentrations, and to qualify the extent of dopant activation, Hall effect results are shown in Table 1. For comparison with similar dopant activation methods, arsenic implanted samples which were microwave processed experienced near complete electrical activation in medium and high dose samples.

Figure 5:
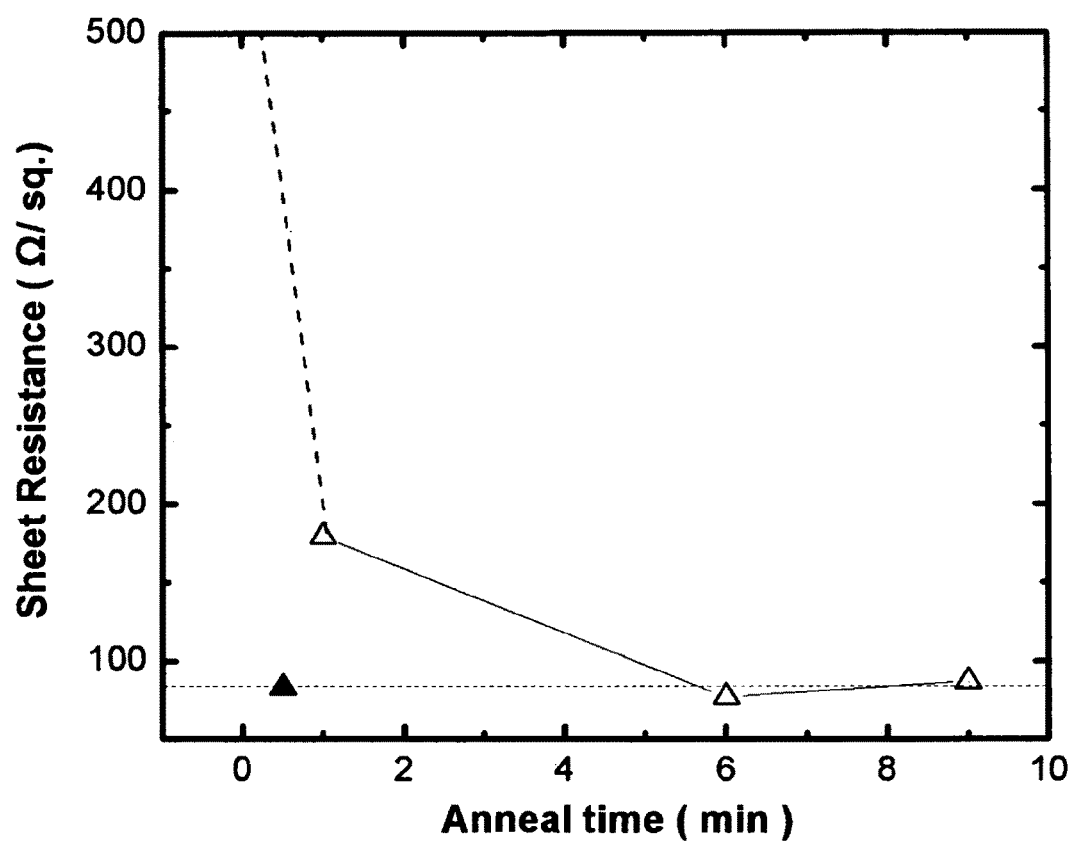
FIG. 5 illustrates sheet resistance versus time for ion implanted Si annealed in accordance with one aspect of the invention.

In order to monitor electrical activation of arsenic during microwave processing, sheet resistance readings were taken as a function of microwave process time. FIG. 5 demonstrates the change in sheet resistance and resistivity for arsenic implanted and microwave annealed silicon, as a function of microwave processing time. As can be seen in FIG. 5, samples VFM annealed realized a decrease in $R_s$ and $\rho$ with time. Of special note in FIG. 5, the $R_s$ nearly saturates for all microwave processing after 6 min. The improved resistivity between the 6 and 9 minute anneals correlates with the improved crystalline structure of the higher temperature anneal. Note that the open triangles display the sheet resistance $R_s$ as a function of VFM treatment time for Si implanted with $5 \times 10^{15}$ As$^+$ cm$^{-2}$. At 6 minutes the sheet resistance is lower than the filled triangle obtained from a 900° C., 30 s RTP anneal.

Figure 6:
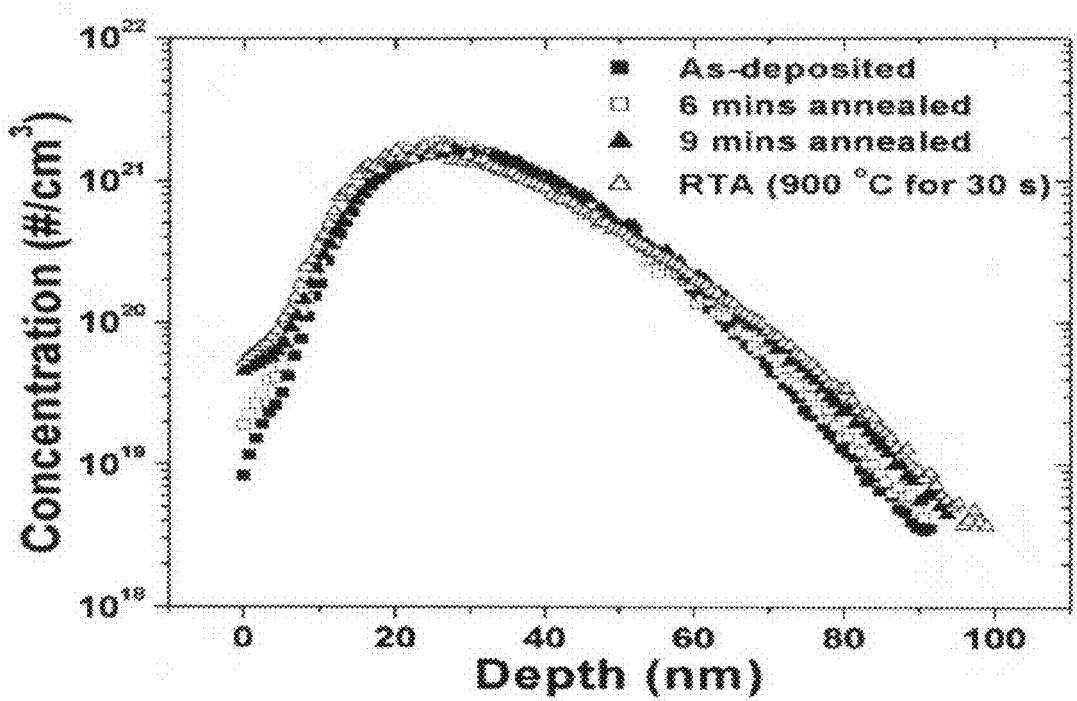
FIG. 6 shows the secondary ion mass spectroscopy (SIMS) plot of concentration of dopant versus the depth in silicon for as-implanted dopant as well as the annealed specimens.

Secondary ion mass spectroscopy results are shown in FIG. 6. The results show that diffusion even after 9 minutes of annealing in VFM is less than diffusion after 900° C. 30 seconds of rapid thermal anneal. Results from the 6 min VFM plot has an even smaller extent of diffusion when compared to the 9 min VFM anneal. These findings confirm inference from sheet resistance measurements that VFM anneal is comparable to a 900° C., 30 seconds RTP anneal, however with less diffusion.

Additional results are presented in Appendix B, "Variable Frequency Microwave Induced Low Temperature Dopant Activation in Ion Implanted Silicon," in Applicants' aforementioned Provisional Application 61/277,542.

The foregoing results demonstrate the usefulness of the present invention for performing rapid annealing of doped semiconductor wafers. Although the specific tests used a particular concentration of As ions in silicon, it will be appreciated by those skilled in the art that other dopants may be used to achieve desired properties and these may be either n-type or p-type materials as are well known in semiconductor fabrication. It will likewise be appreciated that the starting wafer may be any desired form of Si, including intrinsic, p-type, n-type, Si on sapphire, or amorphous Si, or the starting wafer may be another semiconductor such as GaAs, GaN, SiGe, etc. as are familiar in the art.

The invention may also be used for annealing metallized layers to form metal silicides, in conjunction with the methods described in Applicants' U.S. Provisional Pat. App. Ser. No. 61/207,901, filed on Feb. 18, 2009 and entitled, "Method and Apparatus for Controlled Thermal Processing," the entire disclosure of which is incorporated herein by reference.

Other applications of the invention are discussed in the following examples.

TABLE 1

| Time (min) | Bulk concentration ($10^{18}$/cm$^3$) | Resistivity ($10^{-4}$ Ω-cm) | Sheet resistance (Ω/square) | $\chi$Si | $\chi$As | % As on Si |
|---|---|---|---|---|---|---|
| 0 | 9.3 | 22 | 3.038E+08 | 15.8 | 84.1 | 19 |
| 1 | 49 | 23 | 179 | 9.3 | 81.6 | 20 |
| 6 | 113 | 12 | 77 | 3.3 | 11.7 | 91 |
| 9 | 275 | 8 | 87 | 2.8 | 8.5 | 94 |

EXAMPLE

Crystallization of amorphous layers: During the fabrication of integrated circuits it is common to prepare the substrate and form an amorphous silicon (or other semiconductor) layer on the substrate. This film subsequently has to be heated to be crystallized. In some cases crystallization is metal (e.g. aluminum, silver, nickel, palladium) induced and occurs near the eutectic temperatures, which happens to be lower than without introducing any metal. Another method of low temperature crystallization is by annealing in the presence of atomic hydrogen.

The present invention provides a method for a low thermal budget and low stress process by achieving crystallization through uniform heating in the desired temperature range using Variable Frequency Microwaves (VFM). The internal heating and penetrating microwaves can uniformly initiate the nucleation and ensure crystal growth in the film.

EXAMPLE

Densification of dielectric films: This invention also provides a method for low thermal budget and low stress process densification of dielectric layer through volumetric and uniform heating using Variable Frequency Microwaves at temperature usually lower than other heat treatments.

In some cases reported in the literature a silicon dioxide dielectric layer is formed on a substrate surface by a sequential deposition. The deposited layer thickness may be insufficient to prevent substantially complete penetration of annealing process agents into the layer, so the dielectric layer is then annealed to remove water and followed by full densification of the film. The deposition and anneal processes are then repeated until a desired dielectric film thickness is achieved.

For features and trenches during IC fabrication the dielectric film needs to be conformal so that the liquid-like flow properties will allow the high aspect ratio narrow width gaps to fill more efficiently without trapping any voids or seams. When it comes to annealing and densification of these films most surface heating techniques including IR and lasers, have line of sight concerns and will not penetrate deeper. That is where the higher penetration with VFM can achieve uniform densification even deep in the trenches. VFM has been successfully used for anneal and densification of these dielectric films in the temperature range of 350-400° C.

In general any thermal process performed on semiconductor wafer can be performed by volumetric VFM heating which will usually be more efficient than most surface heating techniques.

EXAMPLE

Annealing of single crystal photovoltaic cells: Lately the use of silicon for solar application has exceeded that of the semiconductor market. Thus the same processes of forming p-n junction, annealing to enhance the circuit voltage, drying and firing of the metalized current carrying contacts, need thermal treatment where the VFM enhanced processes will work very well. Some of the specific advantages that apply here are:
1. Rapid, internal and uniform heating
2. Enhanced diffusion with microwave heating
3. Better densification (of films) has been achieved with microwaves
4. Finer and uniform grain structures have been achieved
5. VFM has been used to dry and heat treat metal pastes

EXAMPLE

Annealing of polycrystalline/amorphous silicon photovoltaic cells: Fabrication of single crystal solar cells is expensive and energy extensive. One approach to reduce the cost of these solar cells is to use polycrystalline or amorphous silicon to form the p-n junction. The cost of single crystal growth is eliminated but the efficiencies of the alternatives are lower. Nevertheless, the same thermal treatment necessary for fabrication of single crystal solar cell apply to polycrystalline and amorphous silicon solar cells.

This invention also provides a method for low thermal budget process for the heat treatment and/or anneal at various steps using Variable Frequency Microwaves usually for shorter times or at lower temperature than other heat treatment techniques. With most heat treatments the entire chamber is heated and hence the energy consumption is much higher. With VFM since only the semiconductor is heated and in many cases to a lower temperature, it provides means to lower the thermal budget of what is otherwise an energy extensive process.

EXAMPLE

Heat treatment of thin film photovoltaic cells: To lower the cost of solar cells even further, thin films solar cells have gained substantial momentum. Various semiconductor films (GaAs, CuInSe$_2$, CuGaSe$_2$, CdTe and InP) are deposited on low cost glass or polymeric substrates. Some of the coatings can actually be screen printed or inkjet printed onto flexible substrates. To improve the properties of these coated films have to heat treated. The p-n junctions formed by these films have to be annealed to enhance the open circuit voltage. The key advantages of VFM listed under annealing of single crystal silicon solar cell apply to these films too.

Another film which could be used for the crystalline solar cell but is discussed here in the thin film section is the Transparent Conductive Oxide (TCO). Indium Tin Oxide (ITO) is becoming very popular for this purpose although there are others (AZO and IZO) also being considered. These films act as a top electrode and window to allow sunlight into the junction.

ITO films have unique optical and electrical properties of high transmittance in the visible region and strong reflectance in the infrared (IR) region as well as excellent conductivity.

Thus ITO films play an important role in various optoelectronic devices. The electrical and optical properties of ITO films are found to be strongly dependent on the growth conditions and deposition methods. The crystalline structure, grain size, optical transmittance and conductivity all are influenced by the anneal temperatures, therefore, choosing an appropriate annealing process is important for making high quality ITO films. VFM has been demonstrated to work for annealing, densification and influencing the grain structure.

Therefore this invention also provides a method for low thermal budget process for the heat treatment and/or anneal of ITO and other TCOs using Variable Frequency Microwaves usually for shorter times or lower temperature than other heat treatment techniques.

ITO coatings are also useful on substrates for optoelectronic materials and liquid crystal displays. Phosphor-coated ITO substrates are also used in flat panel displays. Various manufacturers now offer indium tin oxide coated float glass, aluminosilicate glass, and PET coated substrates.

EXAMPLE

Flat panel displays: The use and processing of ITO leads to another example, viz., Flat Panel Displays (FPD) that encompass a growing number of technologies enabling video displays that are much lighter and thinner than traditional television and video displays that use cathode ray tubes. FPD can be divided into two general categories:
1. Volatile displays require that the pixels be periodically refreshed to retain their state, even when displaying a static image. This refresh typically occurs many times a second. These include: Plasma displays; Liquid crystal displays (LCDs); Organic light-emitting diode displays (OLEDs); Light-emitting diode displays (LED); Electro-luminescent displays (ELDs); Surface-conduction electron-emitter displays (SEDs); and Field emission displays (FEDs), also called Nano-emissive displays (NEDs).
2. Static flat panel displays rely on materials where the color states are bistable. No energy is required to maintain the image instead energy is required to change to the next stable state. This results in a much more energy-efficient display, but has a tendency of having slow refresh rates which are not desirable in interactive displays. Bistable flat panel displays are beginning deployment in limited applications (e.g. in outdoor advertising).

The displays briefly described above are diodes (p-n junctions) and generally have the structure of a glass substrate, coated with a TCO which acts as the window and an electrode, then there is a layer of conducting polymer (e.g., an organic light-emitting diode, OLED), the next layer is an emissive coating, and finally the metal electrode.

Various materials and processes used in the manufacturing of these display are the same or similar to those used in the semiconductor manufacturing, which include but are not limited to, spin coating of polyimide (PI), sol-gel approach for nano-hybrids with silica other metal oxide precursors, deposition of low-k materials and films of nanoparticle biodegradable polymer (or nano-composites).

After the above processes there are numerous heat treatments which include but are not limited to:
1. Thermal process required for removing volatile solvents.
2. Thermal treatment of ITO substrates for improvement of OLED performance.
3. Thermal treatment of spin-coated layers on substrate.
4. Thermal treatment of the flexible plastic to increase the optical transparency of substrate.

5. Thermal annealing improves the performance of organic light-emitting diodes containing BCP/LiF/Al.
6. Low Temperature Poly-Silicon (LTPS) annealing is the preferred approach for producing the critical poly-silicon layer during active matrix OLED Flat Panel Display fabrication.
7. Turn-on voltages, luminance, and driving current of the flexible organic light emitting devices (OLEDs) are strongly affected by the thermal history of the flexible substrate.
8. Thermal annealing of fluorescent one-layered organic light-emitting devices (OLEDs) doped with organic salts shows homogeneous and enhanced electroluminescence.

VFM processing has been successfully been applied to curing of polyimide and other polymeric coatings on wafers and annealing in semiconductor manufacturing. Some specific advantages for flat panel displays cells include:
1. Rapid, internal and uniform heating of the coatings
2. Enhanced diffusion with microwave heating
3. VFM can rapidly cure nano-particle polymeric films and nano-composites
4. Better densification (of films) can be achieved with microwaves
5. Finer and uniform grain structure can be achieved
6. VFM can dry and heat treat metal pastes used as electrodes It will be appreciated that, although some of the foregoing examples were directed particularly to VFM systems, the invention may also be used to improve uniformity in fixed-frequency heating systems. Such systems may employ microwave generators using magnetrons, klystrons, gyrotrons, or other microwave power generating devices as are well known in the art. The applicator cavity may be single-mode or multimode as are well known in the art.

It will be appreciated that many suitable noncontacting thermal measurement devices are available from various manufacturers; devices include one-color pyrometers, two-color pyrometers, and fiber optic temperature monitors. All of these devices are familiar to those skilled in the art.

We claim:

1. An apparatus for processing semiconductor wafers comprising:
   a microwave applicator cavity;
   a microwave power supply configured to deliver power to said applicator cavity;
   a dielectric support configured to support a wafer-shaped semiconductor component having a selected diameter;
   a first temperature measuring device positioned to measure the temperature near the center of said wafer and a second temperature measuring device positioned to measure the temperature near the edge of said wafer; and
   a dielectric gas manifold configured to supply a controlled flow of inert gas proximate to the periphery of said semiconductor wafer to provide differential cooling to said wafer edge relative to said wafer center.

2. The apparatus of claim 1 further comprising a feedback control system controlling said flow of inert gas to minimize the radial temperature gradient as measured by said first and second temperature measuring devices.

3. The apparatus of claim 1 wherein said first and second temperature measuring devices are selected from the group consisting of: one-color optical pyrometers; two-color optical pyrometers; and fiber optic temperature monitors.

4. The apparatus of claim 1 wherein said semiconductor comprises a material selected from the group consisting of: Si, intrinsic Si, p-type Si, n-type Si, amorphous Si, GaAs, GaN, and SiGe.

5. The apparatus of claim 1 wherein said microwave cavity is selected from the group consisting of: single-mode cavities and multimode cavities.

6. The apparatus of claim 1 wherein said microwave power supply comprises a device selected from the group consisting of: magnetrons, klystrons, gyrotrons, and traveling wave tubes.

7. The apparatus of claim 1 wherein said semiconductor comprises a substantially monolithic wafer.

8. The apparatus of claim 1 wherein said semiconductor comprises a layer of semiconducting material on a selected substrate.

9. A method for processing semiconductor wafers comprising the steps of:
   a) supporting a semiconductor wafer to be processed on a dielectric supporting member within a microwave applicator cavity;
   b) introducing microwave energy into said applicator cavity;
   c) simultaneously measuring the temperature of said wafer at a first point near its center and at a second point near its periphery; and,
   d) supplying a controlled flow of gas proximate to the periphery of said wafer sufficient to provide differential cooling to the wafer edge relative to the wafer center.

10. The method of claim 9 wherein said semiconductor comprises a material selected from the group consisting of: Si, intrinsic Si, p-type Si, n-type Si, amorphous Si, GaAs, GaN, and SiGe.

11. The method of claim 9 wherein step (d) includes controlling said gas flow according to a process recipe determined initially using said temperature measurements taken at said first and second points on said wafer.

12. The method of claim 9 wherein step (d) includes controlling said gas flow in real time by a feedback control system using said simultaneous temperature measurements.

13. The method of claim 9 wherein said semiconductor wafer is substantially monolithic.

14. The method of claim 9 wherein said semiconductor wafer comprises a layer of semiconducting material on a selected substrate.

15. A method for processing semiconductors comprising the steps of:
   a) supporting a generally planar semiconductor component to be processed on a dielectric supporting member within a microwave applicator cavity;
   b) introducing microwave energy into said applicator cavity;
   c) simultaneously measuring the temperature of said component at a first point near its center and at a second point near its periphery; and,
   d) supplying a controlled flow of gas proximate to the periphery of said component sufficient to provide differential cooling to the wafer edge relative to the wafer center.

16. The method of claim 15 wherein said generally planar semiconductor component is selected from the group consisting of: Si wafers, Si on sapphire, indium tin oxide, indium tin oxide on glass, GaAs on glass, CuInSe$_2$ on glass, CuGaSe$_2$ on glass, CdTe on glass, and InP on glass.

17. The method of claim 15 wherein said generally planar semiconductor component is a Si wafer further having a dielectric coating thereon.

18. The method of claim 17 wherein said dielectric coating is selected from the group consisting of: silicon dioxide, and polymers.

* * * * *